United States Patent [19]
Coleman, Jr.

[11] Patent Number: 5,608,201
[45] Date of Patent: Mar. 4, 1997

[54] METHOD AND APPARATUS FOR DETECTING EDGES IN A SIGNAL OBTAINED FROM A BAR CODE SCANNED IN THE FRESNEL ZONE

[75] Inventor: Edward P. Coleman, Jr., Fairport, N.Y.

[73] Assignee: PSC Inc., Webster, N.Y.

[21] Appl. No.: 368,787

[22] Filed: Jan. 4, 1995

[51] Int. Cl.$^6$ .................................................. G06K 7/10
[52] U.S. Cl. ............................................................. 235/462
[58] Field of Search ............................................. 235/462

[56] References Cited

U.S. PATENT DOCUMENTS

| | | | |
|---|---|---|---|
| 4,091,379 | 5/1978 | Wu et al. | 235/462 |
| 4,593,186 | 6/1986 | Swartz et al. | 235/472 |
| 4,749,879 | 6/1988 | Peterson et al. | 235/462 |
| 5,019,698 | 5/1991 | Eastman | 235/462 |
| 5,200,597 | 4/1993 | Eastman et al. | 235/455 |
| 5,210,397 | 5/1993 | Eastman | 235/436 |
| 5,212,371 | 5/1993 | Boles et al. | 225/472 |
| 5,237,161 | 8/1993 | Grodevant | 235/462 |
| 5,250,790 | 10/1993 | Melitsky et al. | 235/462 |
| 5,250,792 | 10/1993 | Swartz et al. | 235/472 |
| 5,258,604 | 11/1993 | Behrens et al. | 235/462 |
| 5,475,206 | 12/1995 | Reddersen et al. | 235/462 |

FOREIGN PATENT DOCUMENTS

| | | | |
|---|---|---|---|
| 165979 | 7/1988 | Japan | 235/462 |
| 93/17396 | 9/1993 | WIPO | 235/462 |

*Primary Examiner*—John Shepperd
*Attorney, Agent, or Firm*—Joseph F. Murphy

[57] ABSTRACT

A system for use in a bar code processing system using a combination of a first derivative signal and a second derivative signal to determine the bar edge. The predominant signal in determining the edge is the second derivative signal. A zero-cross of the second derivative signal occurs at the bar edge. The first derivative signal is used to qualify the point in time in the second derivative signal for which a zero-cross is examined the system is particularly suited for near filled operation.

11 Claims, 7 Drawing Sheets

METHOD AND APPARATUS FOR DETECTING EDGES IN A SIGNAL OBTAINED FROM A BAR CODE SCANNED IN THE FRESNEL ZONE

BACKGROUND OF THE INVENTION

The instant invention relates to an apparatus and method for detecting edges in a signal obtained using a bar code scanner, and in particular a method and apparatus capable of effectively detecting the edges even when the signal is obtained from an optical code located in the Fresnel zone of the scanning device.

Scanning devices used for reading optical indicia have become increasingly important in many different work environments. For example, bar code scanners have been used for inventory control in warehouses, grocery stores, automated machine assembly plants, etc. The instant invention is particularly adapted for use in such bar code readers or other scanners of various types in which the scanner is held stationary while the beam is swept across the optical indicia or code. In such scanners, the illumination from the code is detected, using for example a CCD, to produce analog signals. These analog signals transition in polarity from a relatively high polarity to a relatively low polarity as the illumination changes due to black and white regions in the code or optical indicia. The transitions are then processed into a train of pulses corresponding to the code and the pulses are recognized. More particularly, the pulses will correspond generally to numbers or letter depending upon the protocol of the optical indicia read. One such protocol is the universal product code (UPC), commonly used on grocery and other products.

The detailed design of bar code reading instruments is described in U.S. patent application Ser. No. 08/056,887, filed Apr. 2, 1993 by Chay La, and entitled "Non-Contact Actuated Trigger Apparatus for Bar Code Laser Scanner"; U.S. Pat. No. 5,258,604, which was issued to James Behrens et al. on Nov. 2, 1993, and is entitled "Bar Code Scanner"; U.S. Pat. No. 5,237,161, which was issued to Scott R. Grodevant on Aug. 17, 1993 and is entitled "System for Automatically Reading Symbols, Such as Bar Codes, on Objects Which are Placed in the Detection Zone of a Symbol Reading Unit, Such as a Bar Code Scanner"; U.S. Pat. No. 5,212,371, which was issued to John A. Boles et al. on May 18, 1993 and is entitled "Hand Held Bar Code Scanner with Improved Aiming Means"; U.S. Pat. No. 5,200,597, which was issued to Jay M. Eastman et al. on Apr. 6, 1993 and is entitled "Digitally Controlled System for Scanning and Reading Bar Codes"; and U.S. Pat. No. 5,019,698, which was issued to Jay M. Eastman et al. on May 28, 1991 and is entitled "Bar Code Reading System Having Electrical Power Conservation and Laser Radiation Power Limiting Means." The entire contents of all of the patents and the patent application listed above are incorporated herein by reference. This application and the above-identified patent applications and patents are owned by PSC, Inc. (Webster, N.Y.).

U.S. Pat. No. 5,250,790, which was issued to Boris Melitsky et al. on Oct. 5, 1993, entitled "Hand-Mounted Scanner with Automatic Manual Initiation of Reading Indicia"; U.S. Pat. No. 5,250,792, which was issued to Jerome Swartz et al. on Oct. 5, 1993, entitled "Portable Laser Diode Scanning Head"; and U.S. Pat. No. 4,593,186, which was issued to Jerome Swartz on Jun. 3, 1986, entitled "Portable Laser Scanning System and Scanning Methods," all assigned to Symbol Technologies, Inc. (Bohemia, N.Y.), disclose other conventional scanners.

As the uses for such scanning devices increase, the demand for more versatile scanners has also increased. The scanners must be capable in operating in a variety of different lighting conditions and at a variety of different distances. These demands have placed increasing demands on the recognition apparatus since the signal of the indicia read by the scanner will have increased noise and a more complex structure. One problem which is associated with bar code scanners occurs when the scanner is used in the "Fresnel Zone" (or "near field") of operation.

In bar code scanning, most systems have an aperture through which light is transmitted to the optical code and reflections are received. As a result of the aperture, the light is diffracted and produces interference patterns in the beam. Typically, these patterns will exist in the "near field" (i.e., close to the scanner). The diffraction pattern obtained in the near field is a Fresnel pattern. Optical codes read from the "near field" (also herein referred to as the Fresnel zone) present a unique challenge for the optical code readers due to the intensity profile of the read image.

Figure 1A:
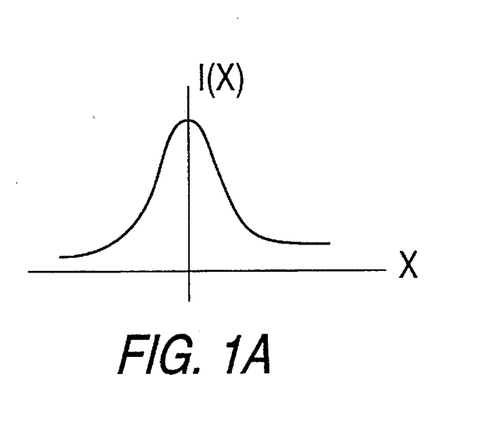
FIGS. 1A–1C illustrate wave profiles for various detected signals in both the far and near fields.
Figure 1B:
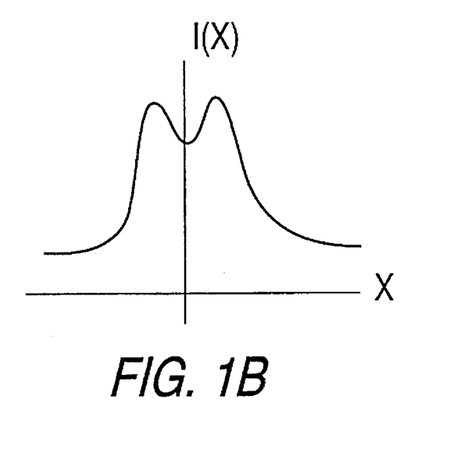
Figure 1C:
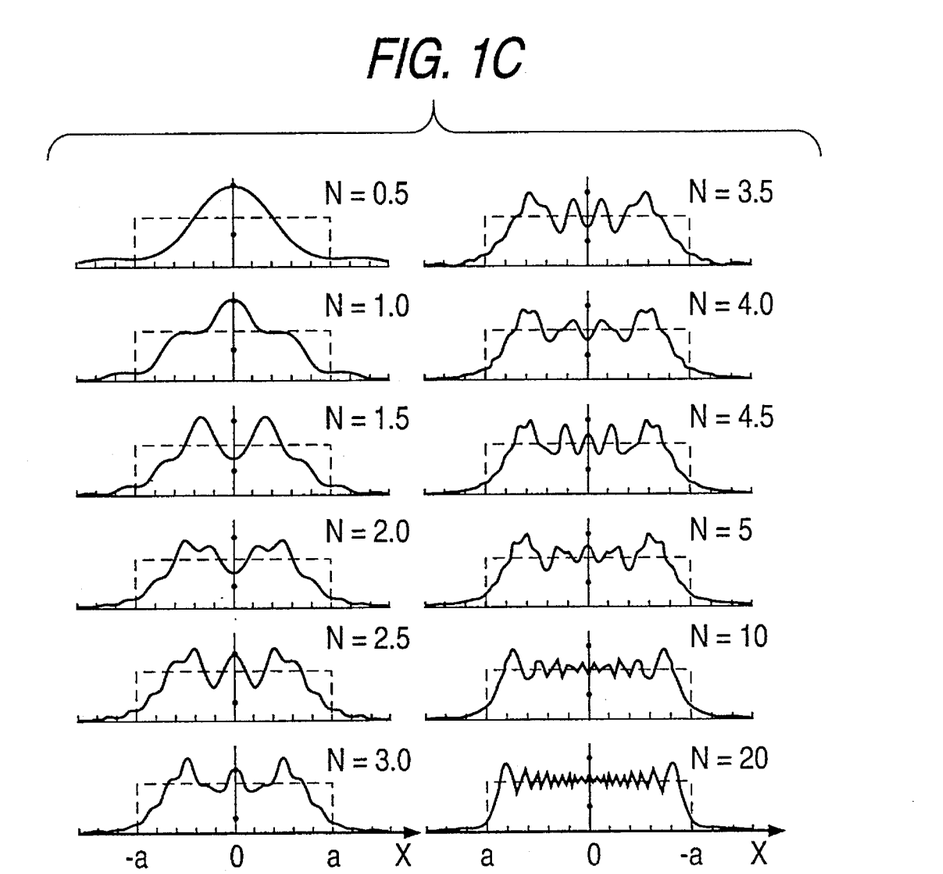

FIG. 1A depicts the expected intensity I(x) of a signal representing a read bar code as a function of distance x for a transition read in the "far field" (i.e., far away from the scanner). FIG. 1B illustrates the intensity profile for a Fresnel diffraction pattern having a Fresnel number of 2. As can be seen in FIG. 1B, the intensity profile has two lobes with a "dip" at the center. The scanning beam profiles for various Fresnel numbers are illustrated in FIG. 1C. More particularly, FIG. 1C illustrates intensity profiles having a Fresnel number N. Note that larger values of N mean that one is moving closer to the source aperture. The Fresnel number N is calculated according to the formula:

$$N = a^2 / \lambda d,$$

where a is the aperture radius, $\lambda$ is the wavelength and d is the distance from the aperture.

One problem encountered by conventional scanners is extracting (detecting) the edges of the code with a signal which is obtained in the Fresnel zone (i.e., when the scanning is carried out at close range or at contact with the scanner housing). As the above equation illustrates, the scanning distance at which a Fresnel pattern is generated depends on the size of the aperture. In a system where a very large aperture is used to produce a large amount of light on the optical indicia being scanned, the Fresnel zone may extend 10 to 20 inches from the scanner. In other words, the larger the aperture the further the near field will extend and the more complex the intensity profile will be at a given distance (FIG. 1C).

Various techniques have been employed to accurately extract transitions (edges) of the code read by a scanner when the scanner is used near the read optical indicia. One such technique reduces the occurrences of the diffraction pattern by placing a very small aperture in front of the laser light emitted from the scanner in order to shorten the length of the Fresnel zone. One drawback associated with this technique is that less light is provided to the optical indicia or code to be read. Thus, the range of the scanner is decreased since for a given laser power, less light reaches the target.

Figure 2A:
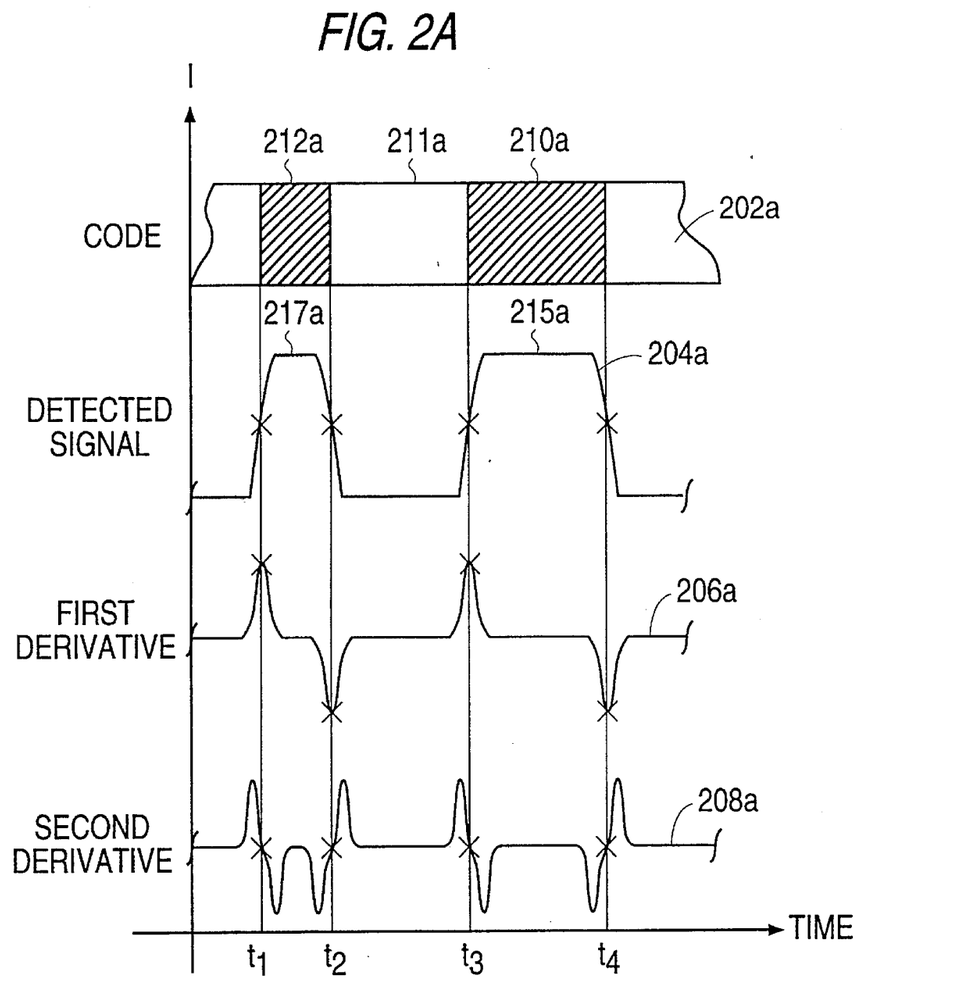
FIGS. 2A–2B illustrate bar code optical indicia, the detected signal for the bar code, and the first and second derivatives of the detected signal for the "far field" and the "near field", respectively.
Figure 2B:
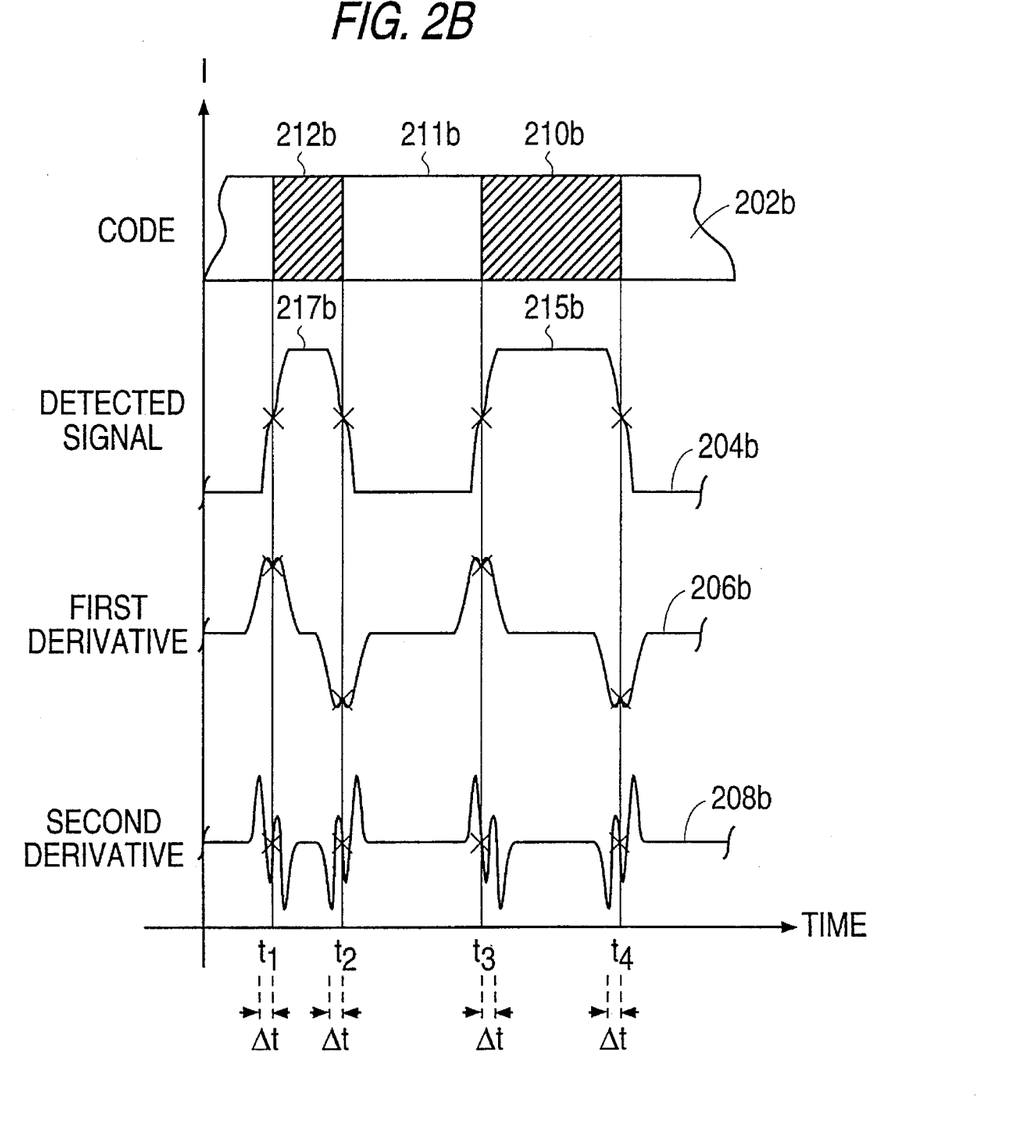

Other conventional techniques used to extract edges in the detected signal do not adequately allow for the many possible different waveforms which are produced when the scanner is used in the Fresnel zone. One such system uses the first derivative of the detected signal and performs a level detect on the signal of the first derivative. FIGS. 2A and 2B illustrate bar code optical indicia 202a, 202b, the detected signal 204a, 204b for the bar code, the first derivative 206a, 206b of the detected signal and the second derivative 208a, 208b of the detected signal, for scanning operations carried out in the "far field" and the "near field", respectively. As illustrated in FIGS. 2A–2B, the edges of the transitions at times $t_1$–$t_4$ (e.g., white-to-black, black-to-white) occur at the center of the peaks in the first derivative 206a, 206b. In the above described conventional system, the level of the first derivative 206a, 206b is examined to detect a mid-scale on each of the peaks to approximate where the edges are. This technique can only approximate the location of the transitions and may produce inaccurate results where the signal has a Fresnel pattern as illustrated in FIG. 2B, for example.

Other conventional systems have attempted to process the undifferentiated bar code signal 204a, 204b but have still been unable to sufficiently detect the edges of complex Fresnel patterns. Still other systems use a combination of the above techniques. One conventional system uses the first derivative signal compared to a phase shifted first derivative signal. Such a technique is described in U.S. Pat. No. 5,210,397, entitled "Differentiating and Integrating Circuit for Translating Bar Code Signals into Corresponding Pulses."

Each of the above techniques does not adequately provide an edge detection apparatus which will work in both the near field and far field while still having a long range for acceptable scanning performance. It is therefore an object of the instant invention to provide an apparatus and method for accurately detecting the edges of a bar code read by a scanner which overcomes the above drawbacks of conventional techniques.

It is another object of the instant invention to provide a scanning device which includes circuitry which effectively processes a detected signal obtained in the Fresnel zone and accurately detects transitions (edges) in this zone.

SUMMARY OF THE INVENTION

In order to achieve the forgoing and other objects there is provided an apparatus for detecting an edge in a scanned signal representing optical indicia read by a scanner, which includes: a first differentiation circuit connected to receive the scanned signal and to produce a first derivative signal indicative of a derivative of the scanned signal; a second differentiation circuit connected to receive the first derivative signal to produce a second derivative signal indicative of a derivative of the first derivative signal; an edge qualifying circuit connected to receive the first derivative signal to produce a detect enabling signal which corresponds to a preset value of the first derivative signal; and an edge detecting circuit connected to receive the second derivative signal and the detect enabling signal to produce an edge detection signal when the second derivative signal reaches a predetermined value following receipt of the detect enabling signal.

In accordance with the instant invention there is a method for detecting edges in a scanned signal representing optical indicia read by a scanner which includes the steps of: generating a first signal indicative of a first derivative of the scanned signal; generating a second signal indicative of a second derivative of the scanned signal; detecting when the first signal reaches a first predetermined value; determining when the second signal reaches a second predetermined value immediately following the detection of the first signal reaching the first predetermined value; and outputting a signal indicating the edge when the second signal reaches the second predetermined value.

BRIEF DESCRIPTION OF THE DRAWINGS

The forgoing and other objects, features and advantages of the instant invention will become more apparent from the following detailed description of the invention in connection with the accompanying drawings in which.

DETAILED DESCRIPTION OF THE PREFERRED EMBODIMENTS

Referring to FIGS. 2A and 2B, the principles and features of the instant invention will be described in greater detail. FIGS. 2A and 2B depict a bar code 202a, 202b which is one-type of optical indicia commonly read by the type of scanning devices for which the instant invention is directed. A detected signal 204a, 204b is depicted for each of the bar codes 202a, 202b. The detected signal 204a, 204b is produced by the bar code scanner and provided to the processing circuitry. As illustrated in FIGS. 2A and 2B, the bar code 202a, 202b includes black 210a, 210b, 212a, 212b and white 211a, 211b portions of varying widths. The detected signals 204a, 204b correspond to the bar code 202a, 202b having an inverse polarity. In other words, in correspondence with the wide black sections 210a, 210b of the bar code 202a, 202b, the intensity of the detected signal 204a, 204b goes relatively high and flat 215a, 215b. Where the detected signal corresponds to narrower black spaces 212a, 212b relatively narrower width 217a, 217b intensity profile is evident. If the width of the bar is sufficiently narrow, the intensity of the detected signal will also be lower, as the maximum intensity will not be reached. Similarly, the portions of the detected signal corresponding to wide and narrow white spaces have wide and narrow negative values respectively. It should also be understood that a non-inverted signal could be used such that the high values of the detected signal correspond to the white spaces and the low (negative) values correspond to the black bars. The detected signal 204a, 204b is depicted as the intensity in the spatial domain, I(x) convolved with the bar code pattern as defined in the spatial domain S(x).

FIGS. 2A and 2B also depict the first 206a, 206b and second 208a, 208b derivatives of the detected signal 204a, 204b. The detected signal 204a depicted in FIG. 2A represents a scanned signal obtained in the far field. In contrast, the signal 204b depicted in FIG. 2B represents a detected signal attained in the near field. The first derivative signals 206a, 206b depicted in FIGS. 2A and 2B correspond to the profiles depicted in FIGS. 1A and 1B, respectively. In the far zone, there is one transition in the second derivative signal 208a from positive through zero to negative and one transition from negative through zero to positive for each bar code 202a transition or edge (black-to-white or white-to-black). In the second derivative signal 208a, the transitions through zero (i.e., zero-crosses) correspond to the location of the edges on the bar code label.

In FIG. 2B, the first derivative signal 206b distinctly exhibits a Fresnel pattern characteristically indicating that the scanning occurred in the near field. In this case, the pattern corresponds to a Fresnel number of 2. For a Fresnel number 2, there are three transitions (one from negative through zero to positive and one from positive through zero to negative and finally one from negative through zero to positive) for each transition edge (white-to-black) on the bar code 202b label. Here, the second derivative signal 208b has zero-crosses which corresponds in time ($t_1$–$t_4$) to the location of edges in the bar code 202b label scanned. However, in this case the increase structure on the detected signal 204b and therefore in the second derivative 208b, produces multiple zero-crosses for any particular edge. Thus it is not readily apparent to the system when a zero-cross indicates an edge. This effect is even more pronounced as the Fresnel number N increases.

Figure 3:
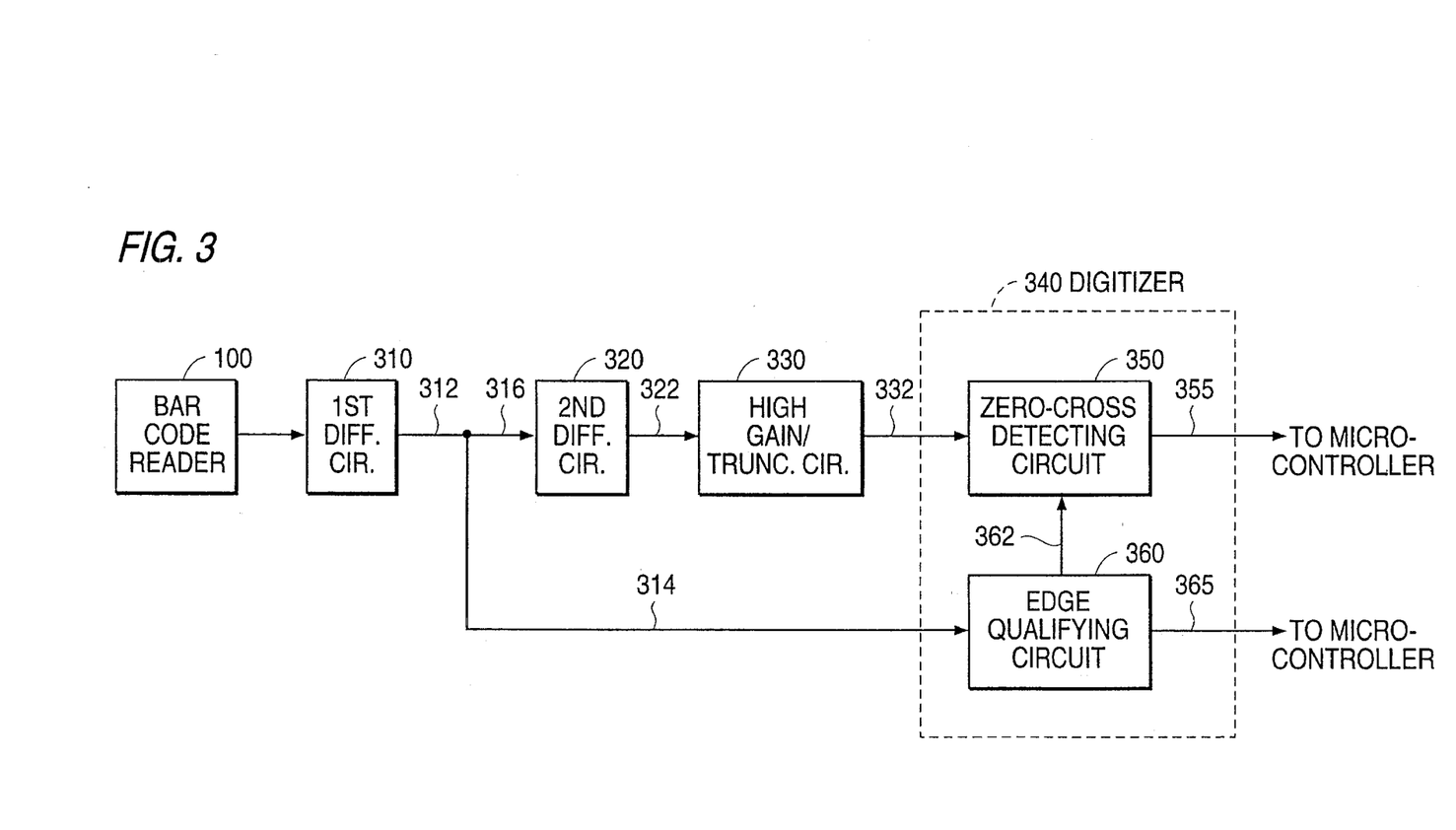
FIG. 3 illustrates an apparatus according to an embodiment of the instant invention.

FIG. 3 illustrates an apparatus according to an embodiment of the instant invention which accurately detects the bar code edge even when the detected signal has a complex profile as in the case of bar codes scanned in the Fresnel zone. While the following example is explained with reference to a bar code, the features thereof could be used in any system which reads optical indicia where transitions in the indicia contain the relevant information.

In FIG. 3, a bar code reader 100 scans a bar code label and produces a detected signal similar to the signals depicted in FIGS. 2A and 2B. This signal is provided to a first differentiation circuit 310. The output of the first differentiation circuit is provided to a second differentiation circuit 320 and a digitizer 340. The second differentiation circuit 320 differentiates the first derivative signal provided from the first differentiation circuit along line 316 to produce a second derivative signal at output line 322. The second derivative signal on line 322 is provided to a nonsaturable high gain amplifier/truncation circuit 330. The high gain amplifier/truncation circuit 330 is used to greatly amplify the zero-crosses in the second derivative. This is desired since the only information used in the second derivative signal is the zero-cross locations as more fully described below. The high gain amplifier/truncation circuit 330 also operates to truncate the output of line 332 to prevent the output from saturating amplifiers used in the digitizer 340 causing undue delays as a result of the saturation. Thus, the truncation level will be determined by the actual components (e.g., amplifiers) used in the digitizing circuit. As more fully described below, the zero-cross as used herein may correspond to any voltage which is a reference voltage around which the high and low peaks of the second derivative 208a, 208b oscillate. The output 332 of the high gain amplifier/truncation circuit 330 is also provided to the digitizer 340.

The digitizer 340 has two principal functioning circuits. The first circuit is a zero-cross detecting circuit 350. The zero-cross detecting circuit 350 is connected to receive the output 332 from the high gain amplifier/truncation circuit 330. The digitizer 340 also includes an edge qualifying circuit 360 which receives the output of the first differentiation circuit 310 from lines 312 and 314. The edge qualifying circuit 360 operates to detect the location of primary peaks in the first derivative signal at each polarity (i.e., both positive and negative peaks). The edge qualifying circuit 360 then provides an enabling signal 362 to the zero-cross detecting circuit 350. The enabling signal 362 from the edge qualifying circuit 360 is produced such that the zero-cross detecting circuit 350 detects one zero-cross in the second derivative signal for each peak value in the first derivative signal. In other words, the combination of the edge qualifying circuit 360 and the zero-cross detecting circuit 350 allows the digitizer to receive the first derivative signal and to detect the next following zero-cross in the second derivative signal.

Each zero-cross detected by the zero-cross detecting circuit 350 changes the level of the output signal at line 355 from the zero-cross detecting circuit 350. In other words, the output signal of line 355 is a digital signal which transitions from high to low and low to high on the occurrence of each edge in the bar code. Accordingly, the output signal at line 355 is a pulse train which accurately depicts the location of black and white portions in the bar code.

The edge qualifying circuit 360 also provides an output at line 365 which is a digital representation of the first derivative signal. Each of output line 355 and 365 is provided to a microcontroller (not shown). The microcontroller decodes the pulse train signals from line 355 and recognizes the information contained in the particular bar code read by the bar code reader 100. The output of line 365 of the edge qualifying circuit is also provided to the microcontroller for operations which require the use of a first derivative signal. For example, in certain scanning systems, the first derivative is used to detect whether an object is located in front of the scanner. In such systems, the laser may be pulsed while the system looks for a return signal to see whether a bar code is located in front of the scanner. Since the system only looks for the existence or absence of transitions to determine the existence of a bar code, the zero-cross information contained in the second derivative need not be used.

Figure 4:
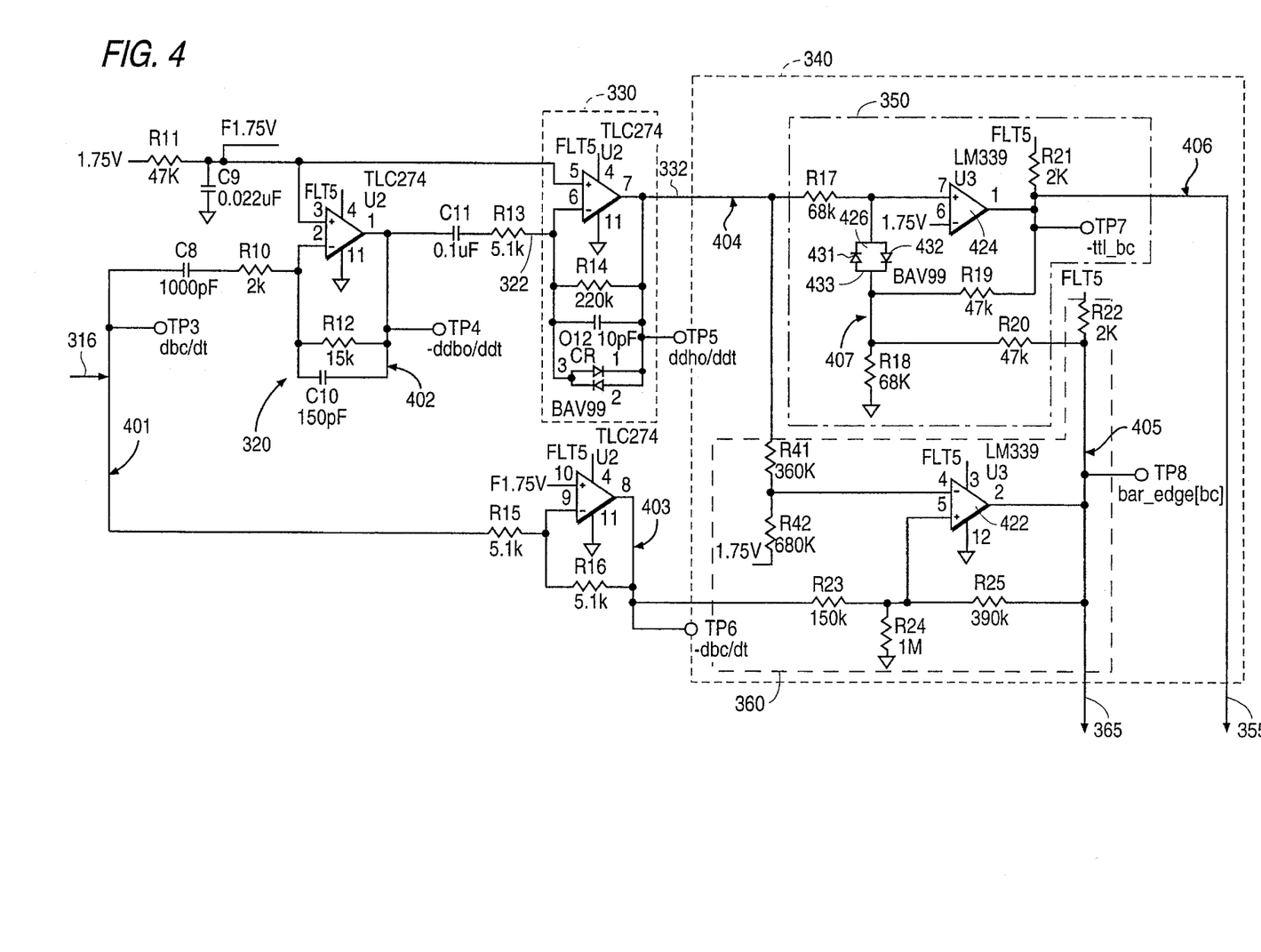
FIG. 4 illustrates a more detailed implementation according to another embodiment of the instant invention.

FIG. 4 illustrates a detailed circuit of a more specific embodiment according to the instant invention. Common elements in the embodiments of FIGS. 3 and 4 are represented by like reference numerals. In FIG. 4, the first derivative signal from line 316 is provided from the first differentiation circuit 310 (not shown). The second differentiation circuit 320 produces the second derivative signal at line 322 which is supplied to the high gain amplifier/truncation circuit 330. The output of the high gain amplifier/truncation circuit 330 is provided to the digitizer 340. The first derivative signal along line 401 is inverted, and the inverted signal along line 403 is also provided to the digitizer 340.

The edge qualifying circuit 360 of the digitizer 340 comprises resistors R41, R42, R23, R24, R25, R22 and amplifier 422 (U3). The zero-cross detecting circuit 350 includes resistors R17, R21, R19, R20, R18, amplifier 424 and a pair of diodes 426.

The operation of the digitizer 340 will now be described. The description begins by examining the TTL level of pin 2 of amplifier 422. The value will always be either zero or near 5 volts. The output of pin 2 is coupled to the zero-cross detecting circuit 350 through resistor R20. The value of this signal will effect node 433 on the diodes 426. Node 433 of the diodes 426 monitors the possible combinations of the output of pin 1 of amplifier 424 and the output of pin 2 of amplifier 422. If the output on pins 1 and 2 are both high, then the combination of R19 and R20 hold the node 433 of the diodes 426 high enough to disable the operation of the zero-cross detecting circuit 350. This disabling is achieved since diode 431 turns on, forcing pin 7 of amplifier 424 to be held above the 1.75 V reference voltage which holds the output on pin 1 high. The system is now in a transparent mode where any changes in the second derivative 404 will be ignored. Thus, the zero-cross detecting circuit 350 will not detect a zero-cross until the edge qualifying circuit 360 changes (i.e., the first derivative signal cause pin 2 to go low) as described below.

When the output on pin 2 goes low, the combination of R19 and R20, with R19 having a high state applied thereto and R20 having a low state, along with the biasing resistor R18, cause the voltage at node 433 to become approximately 1.75 V which turns both diodes 426 off. When the diodes 426 are both off, the zero-cross detecting circuit 350 is now enabled to detect a zero-cross. Since the output of pin 1 is in a high state, amplifier 424 detects when the value of pin 7 goes below the value on pin 6. In other words, at this stage the zero cross detecting circuit looks for high to low transition.

Once the value of the signal provided to pin 7 transitions from high to low, the output on pin 1 also goes low. At this point the value applied to both resisters R19 and R20 is zero. As a result the diode 432 turns on, pulling pin 7 lower than the reference 1.75 V and locks it there. The zero-cross detecting circuit 350 then remains inactive until the first derivative signal changes the state on pin 2 to a high value again. At this point, the diodes 426 are turned off and the zero-cross detecting circuit 350 is now enabled to detect a low to high transition at pin 7.

It is noted that both amplifiers 422 and 424 are configured as comparators. Amplifier 422 is set up to look for the first derivative to exceed a predetermined voltage. As long as the first derivative doesn't have any activity on it above or below the predetermined voltage it remains in a constant state (i.e the last state which it assumed). In this manner, the amplifier 422 actually locates the leading edge of the first derivative signal (i.e., detects a point along the leading edge the first derivative signal which exceeds the predetermined voltage level).

It is also noted the second derivative signal is delayed relative to the first derivative signal by the high gain amplifier/truncation circuit 330. The delay is on the order of 3–5 microseconds for the components shown in FIG. 4. This delay is acceptable for most bar code bandwidths and actually ensures that the first zero-cross is detected. If it is desired to use a higher bandwidth with this circuit, faster amplifiers could be used. It is also noted that while the instant invention is described as detecting zero-crosses, the "zero" is actually a reference point around which the polarity of the first and second derivative signals oscillate. For example, in the embodiment depicted in FIG. 4, a zero-cross reference voltage is 1.75 V.

Figure 5A:
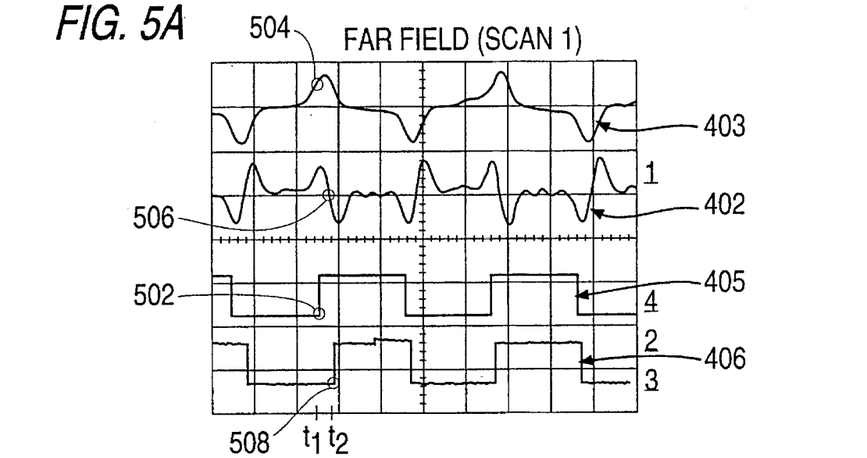
FIGS. 5A–5C illustrate the operation of the apparatus of FIG. 4 when operated in the far field.

FIGS. 5A–5C and 6A–6C illustrate actual signal traces of signals present at the various locations in the apparatus of FIG. 4 for bar code labels scanned in the far and near (Fresnel zone) fields, respectively. In FIG. 5A, the first derivative along line 403 of a first scanned signal is depicted along with its second derivative at line 402 and the output 405 of the edge qualifying circuit 360 and the output at line 406 of the zero-cross detecting circuit 350. As can be seen in FIG. 5A, the leading edge 502 of the output of line 405 of the edge qualifying circuit 360 occurs at time $t_1$ and corresponds to the time where the first derivative at line 403 reaches a predetermined level 504. Similarly, the leading edge 508 of the digitized pulse train along line 406, the output of the zero-cross detecting circuit 350, corresponds at time $t_2$ to the zero-cross 506 of the second derivative signal at line 402.

Figure 5B:
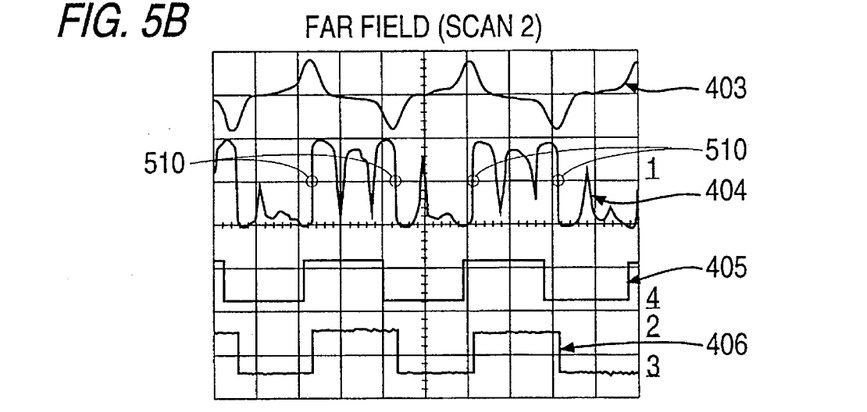

FIG. 5B illustrates the shape of the second derivative signal at line 404 after the operation of the high gain/amplifier/truncation circuit 330. As can be seen in FIG. 5B, the second derivative signal at line 404 is strongly distorted. However, the zero-crosses 510 of the truncated second derivative signal of line 404 are easily identified and distinguished as corresponding to the transitions in the output signal 406. This increased definition illustrates the advantaged gained by employing the high gain/amplifier/truncation circuit 330 in accordance with an embodiment of the instant invention.

Figure 5C:
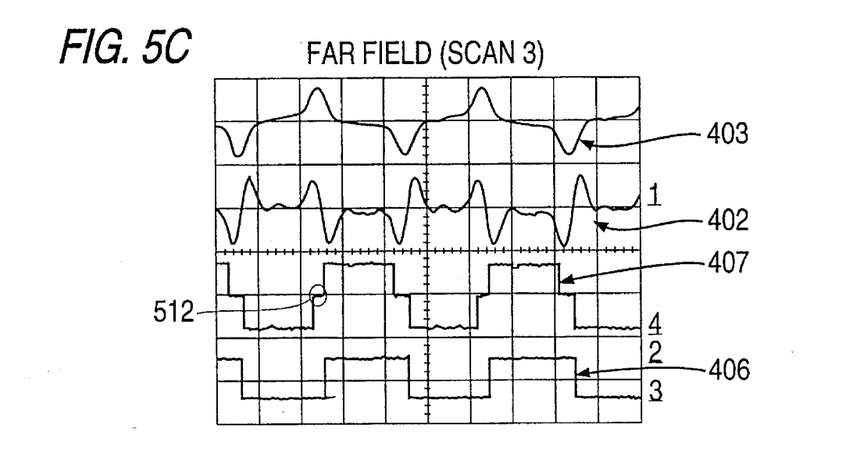

FIG. 5C is similar to FIG. 5A except that the third trace illustrates a signal at line 407 which is provided to the diode 426 (FIG. 4). In the trace of line 407, the relationship between the output on pin 2 of comparator 422 and the output on pin 1 of comparator 424 is shown. In the center portions 512 where the signal at line 407 is flat the output of the two comparators have different values. When the output of the two comparators are both high, the signal on line 407 is high. When the output of the two signal values are low, a signal on line 407 assumes a low value.

Figure 6A:
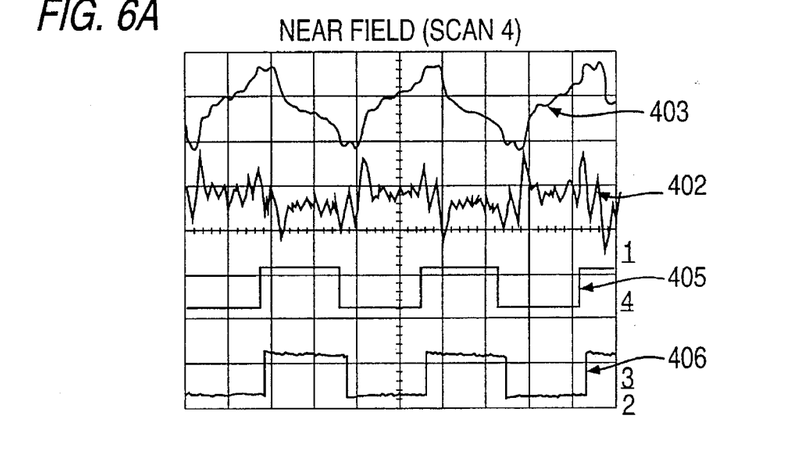
FIGS. 6A–6C illustrate the operation of the apparatus of FIG. 4 when operated in the near field (Fresnel zone).
Figure 6B:
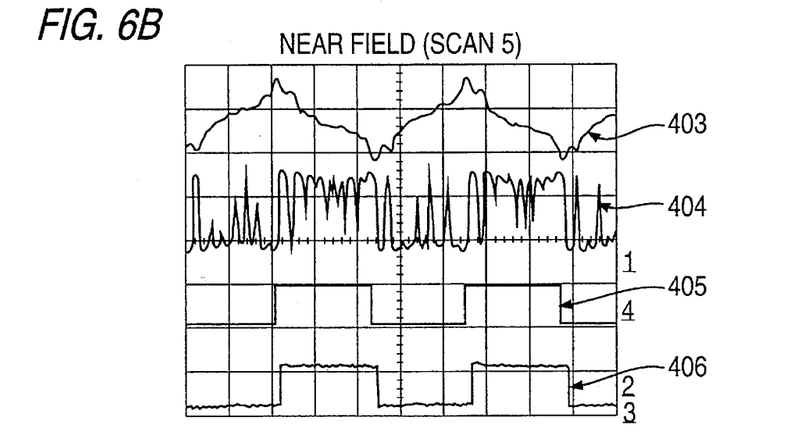
Figure 6C:
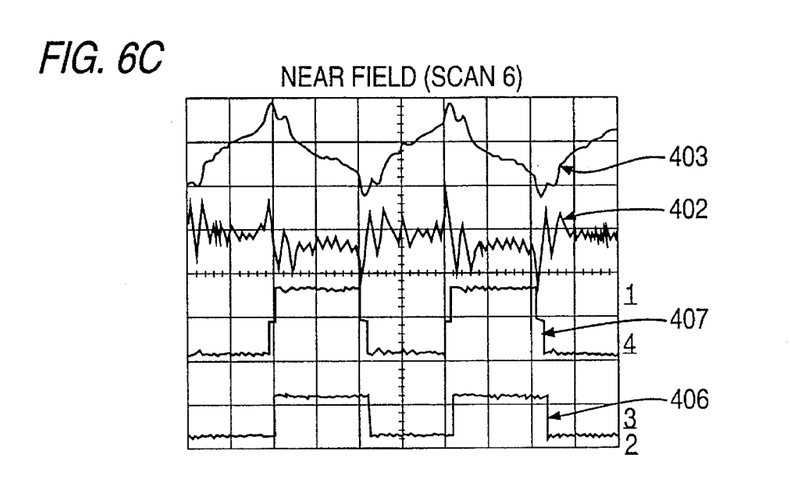

FIGS. 6A through 6C are similar to FIGS. 5A through 5C and depict signals present when the scanning operation is carried out in the Fresnel zone (near field). As depicted in FIG. 6B, for example, the leading and falling edge of the edge output at line 405 of the edge qualifying circuit 360 corresponds in time to a position where the value of the first derivative signal at line 403 exceeds a predetermined level in a positive direction and a predetermined level in a negative direction, respectively. Other similar phenomena as described in connection with the wave forms of FIGS. 5A through 5C are also depicted.

It should be noted that in FIGS. 6A through 6C as well as the circuitry depicted in FIG. 4, a zero-cross associated with the first lobe in the first derivative is actually picked-up as the bar code edge. Thus, along the time line depicted in FIG. 2B, the output signal corresponds to the first zero-cross and is out of phase with the actual bar code. This phase error Δt is constant with respect to each bar code edge. Thus, since the actual information of interest is the relative width of the black and white sections of the bar code which is relatively large compared to the phase error Δt, the phase error does not effect the operation of the system. In other words, all that is necessary to accurately read a bar code is to detect the same transition in the second derivative signal for each bar code edge. This is precisely accomplished according to the instant invention by using the first derivative to qualify the zero-cross detection. It should be understood that more complicated circuitry could be used according to the principles of the instant invention to detect the zero-cross associated with the center of the first derivative signal if needed.

It is also noted that while the instant invention has been described in connection with the above embodiments, the inventive features described herein are not limited to these embodiments. For example, the first derivative edge detection elements in the edge qualifying circuit 360 could comprise an adaptive sense amplifier. In such a system, the threshold on that comparator would be adjusted using a percentage of the peek values of the preceding signal. Such adaptive sense amplifier schemes work well where you have a signal that varies in amplitude significantly over a wide range.

While the above system is described in an analogue environment, one could also add a micro-controlled automatic gain controlled (AGC) stage. This could be used to change the gain of the derivative stage to ensure that a wide range of first derivative signals were available to process and detect their leading edges. The invention could also be implemented with digital logic instead of combining the stages in the analog manner described above. In the described embodiment, one digital type signal is being used to qualify another digital signal. This could be done with purely digital logic as well. Many other variations of the instant invention will be evident to one of ordinary skill upon review of the above disclosure. Accordingly, the instant application is only limited by the appended claims.

What is claimed is:

1. An apparatus for detecting an edge in a scanned signal representing optical indicia read by a scanner, comprising:

a first differentiation circuit connected to receive the scanned signal and to produce a first derivative signal indicative of a derivative of the scanned signal;

a second differentiation circuit connected to receive the first derivative signal to produce a second derivative signal indicative of a derivative of the first derivative signal;

means for delaying said second derivative signal by a sufficient short period of time to ensure that a first reference crossing is detected in said second derivative signal;

an edge qualifying circuit connected to receive the first derivative signal, said edge qualifying circuit outputting a detect enabling signal corresponding to a preset value of the first derivative signal; and an edge detecting circuit connected to receive the delayed second derivative signal and the detect enabling signal, the edge detecting circuit outputting an edge detection signal when the second derivative signal reaches a predetermined value following receipt of the detect enabling signal.

2. An apparatus as recited in claim 1, wherein said edge detecting circuit includes a zero-cross detecting circuit having a predetermined reference voltage about which said first and second derivative signals oscillate.

3. An apparatus as recited in claim 1, wherein the scanned signal represents optical indicia read by the scanner in the Fresnel zone.

4. An apparatus for detecting an edge in a scanned signal representing optical indicia read by a scanner, comprising:

a first differentiation circuit connected to receive the scanned signal and to produce a first derivative signal indicative of a derivative of the scanned signal;

a second differentiation circuit connected to receive the first derivative signal to produce a second derivative signal indicative of a derivative of the first derivative signal;

an edge qualifying circuit connected to receive the first derivative signal, said edge qualifying circuit outputting a detect enabling signal corresponding to a preset value of the first derivative signal, an edge detecting circuit connected to receive the second derivative signal and the detect enabling signal, the edge detecting circuit outputting an edge detection signal when the second derivative signal reaches a predetermined value following receipt of the detect enabling signal;

a high gain amplification circuit connected to receive the second derivative signal, said high gain amplification circuit amplifying the second derivative by a desired gain; and a truncation circuit connected to receive the amplified second derivative signal from the high gain amplification circuit, said truncation circuit truncating the amplified second derivative signal to a predetermined level, the truncated amplified second derivative signal being provided to the edge detecting circuit as the second derivative signal.

5. An apparatus for detecting an edge in a scanned signal representing optical indicia read by a scanner, comprising:

a first differentiation circuit connected to receive the scanned signal and to produce a first derivative signal indicative of a derivative of the scanned signal;

a second differentiation circuit connected to receive the first derivative signal to produce a second derivative signal indicative of a derivative of the first derivative signal;

an edge qualifying circuit connected to receive the first derivative signal, said edge qualifying circuit outputting a detect enabling signal corresponding to a preset value of the first derivative signal;

an edge detecting circuit connected to receive the second derivative signal and the detect enabling signal, the edge detecting circuit outputting an edge detection signal when the second derivative signal reaches a predetermined value following receipt of the detect enabling signal;

wherein the detect enabling signal alternates between a first and second preset value and the edge detecting circuit comprises:

a comparator having a first input, a reference input and an output, with said output alternating between the first and second value each time a value of the first input exceeds a value of the reference input to produce the edge detection signal; and supply means, connected to receive the detect enabling signal, the output from the comparator and the second derivative signal, for supplying the second derivative signal to the first input of the comparator only when the detect enabling signal and the output signal of the comparator have a different value and for maintaining the output of the comparator constant when the detect enabling signal and the output signal of the comparator have a same value.

6. A method for detecting edges in a scanned signal representing optical indicia read by a scanner, the method comprising the steps of:

generating a first signal indicative of a derivative of the scanned signal;

generating a second signal indicative of a derivative of the first signal;

detecting when the first signal reaches a first predetermined value;

delaying the second signal by a sufficient short period of time to ensure that a first reference crossing is detected in said second signal;

determining when the second signal delayed by said short period of time reaches a second predetermined value immediately following the detection of the first signal reaching the first predetermined value; and in response to said determining step, outputting a signal indicating the edge.

7. A method as recited in claim 6, wherein the scanned signal represents optical indicia read by the scanner in the Fresnel zone.

8. A method as recited in claim 6 wherein, said delaying step includes the steps of:

amplifying the second signal; and truncating the amplified second signal to a predetermined level, said truncated amplified second signal being used in said determining step.

9. An apparatus for detecting edges in a scanned signal representing optical indicia read by a scanner, comprising:

means for generating a first signal indicative of a derivative of the scanned signal;

means for generating a second signal indicative of a derivative of the first signal;

means for detecting when the first signal reaches a first predetermined value;

means for delaying the second signal by a sufficient short period of time to ensure that a first reference crossing is detected in said second signal;

means for determining when the delayed second signal reaches a second predetermined value immediately following the detection of the first signal; and means responsive to said determining means, for outputting a signal indicating the edge.

10. An apparatus as recited in claim 9, wherein the scanned signal represents optical indicia read by the scanner in the Fresnel zone.

11. An apparatus as defined in claim 9, wherein said means for delaying comprises:

a high gain amplification circuit connected to receive said second signal, said high gain amplification circuit amplifying said second signal by a desired gain; and a truncation circuit connected to receive the amplified second signal from the high gain amplification circuit, said truncation circuit truncating said amplified second signal to a predetermined level, the truncated amplified second signal being provided to said determining means.

* * * * *